(12) United States Patent
Yoshida et al.

(10) Patent No.: US 8,309,462 B1
(45) Date of Patent: Nov. 13, 2012

(54) DOUBLE SPACER QUADRUPLE PATTERNING WITH SELF-CONNECTED HOOK-UP

(75) Inventors: Akira Yoshida, Nagoya (JP); Kazuya Wakabayashi, Yokkaichi (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/248,314

(22) Filed: Sep. 29, 2011

(51) Int. Cl.
*H01L 21/44* (2006.01)
(52) U.S. Cl. .................. 438/672; 438/667; 438/696
(58) Field of Classification Search .................. 438/667, 438/671, 672, 696, 745
See application file for complete search history.

(56) References Cited

U.S. PATENT DOCUMENTS

| | | | |
|---|---|---|---|
| 5,328,810 A | 7/1994 | Lowrey et al. | |
| 5,866,462 A | 2/1999 | Tsai et al. | |
| 6,951,784 B1 * | 10/2005 | Anderson et al. | 438/157 |
| 7,531,456 B2 | 5/2009 | Kwon et al. | |
| 7,713,818 B2 | 5/2010 | Chan | |
| 7,803,709 B2 | 9/2010 | Yune | |
| 7,807,578 B2 | 10/2010 | Bencher et al. | |
| 7,927,928 B2 | 4/2011 | Pierrat | |
| 8,012,394 B2 | 9/2011 | Sreenivasan | |
| 2003/0203319 A1 | 10/2003 | Lee | |
| 2007/0215960 A1 * | 9/2007 | Zhu et al. | 257/414 |
| 2009/0130852 A1 * | 5/2009 | Kewley | 438/694 |
| 2011/0316114 A1 * | 12/2011 | Niroomand et al. | 257/499 |

* cited by examiner

*Primary Examiner* — Phuc Dang
(74) *Attorney, Agent, or Firm* — Vierra Magen Marcus & DeNiro LLP

(57) ABSTRACT

A photolithographic method for fabricating a pattern which includes a line and a hook-up pad in a semiconductor device, such that the line and the hook-up pad are self-connected to one another by spacer deposition that mitigates a process control issue, and without being misaligned or short circuited. Spacer double patterning lithography can be used. A pattern of sidewall spacer material is formed from a photoresist deposition, conformal spacer material deposition, etching, and removal of the photoresist. A pattern of the sidewall spacer material and a sacrificial layer is formed by performing a further photoresist deposition at a hook-up pad location, a further conformal spacer material deposition, covering part of the sacrificial layer and etching an uncovered part of the sacrificial layer to form a gap. The pattern is transferred to a hard mask layer and then to a wiring layer.

20 Claims, 12 Drawing Sheets

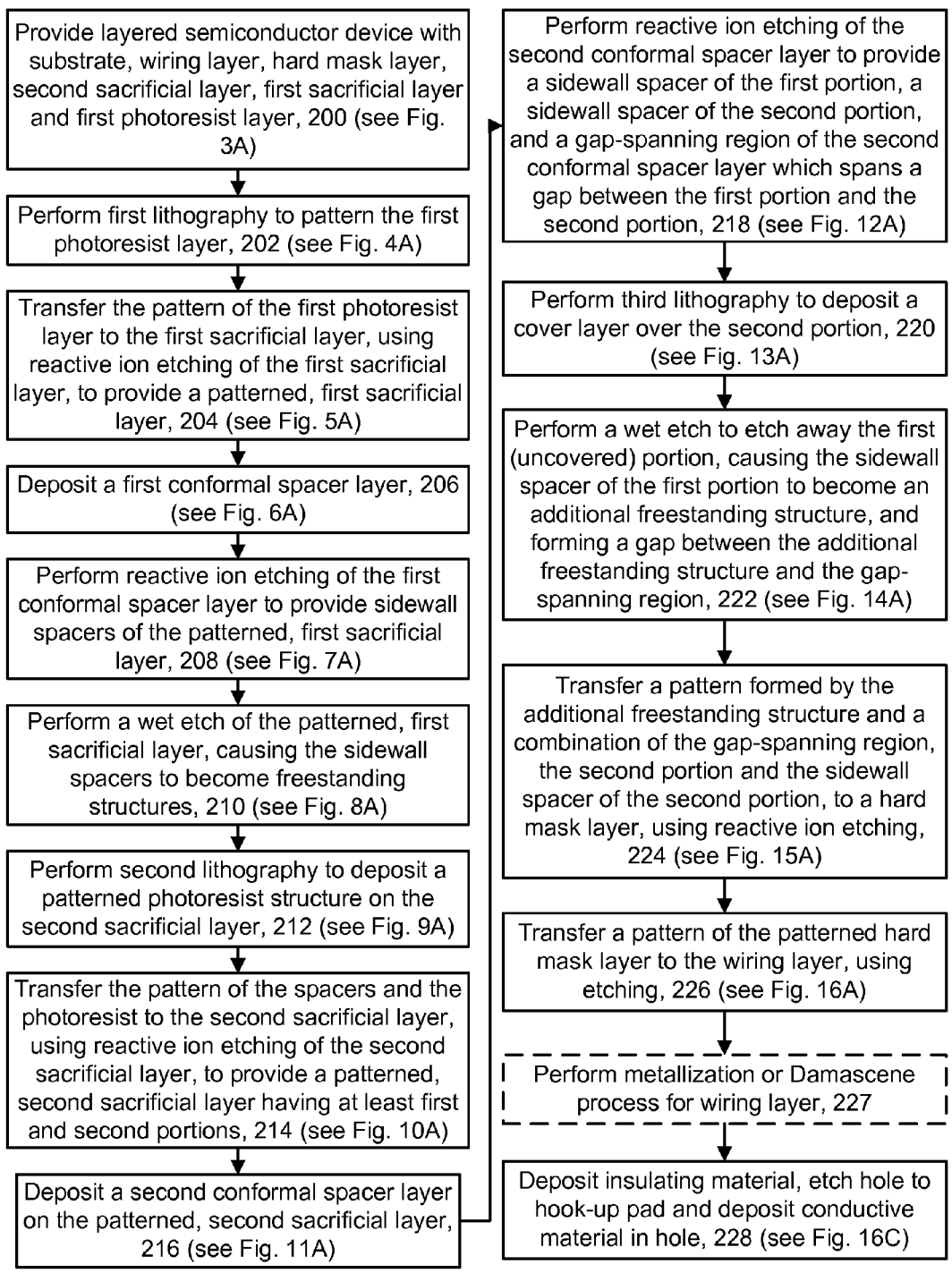

DOUBLE SPACER QUADRUPLE PATTERNING WITH SELF-CONNECTED HOOK-UP

BACKGROUND OF THE INVENTION

1. Field of the Invention

The present invention relates to techniques for patterning integrated circuits.

2. Description of the Related Art

Photolithography is a process used to transfer circuit patterns onto a semiconductor wafer. It uses light to transfer a geometric pattern from a photo mask to a light-sensitive chemical photoresist. A series of chemical treatments such as etching then either engraves the exposure pattern into material underneath the photoresist, or enables deposition of a new material in the desired pattern upon material underneath the photoresist. However, there is a continuing desire to scale down feature sizes. One potential solution is spacer double patterning lithography. In this approach, a first pattern is deposited on a substrate, spacers are formed using the first pattern, the first pattern is removed and a second pattern is deposited. However, many challenges are imposed by spacer double patterning, in terms of process complexity, process control and pattern formation.

BRIEF DESCRIPTION OF THE DRAWINGS

FIG. 2 depicts an example photolithographic method for fabricating a pattern which includes a line and a hook-up pad in a semiconductor device.

DETAILED DESCRIPTION

A photolithographic method is provided for fabricating a pattern which includes a line and a hook-up pad in a semiconductor device. A corresponding semiconductor device is also provided.

Like-numbered elements refer to common components in the different figures.

Figure 1A:
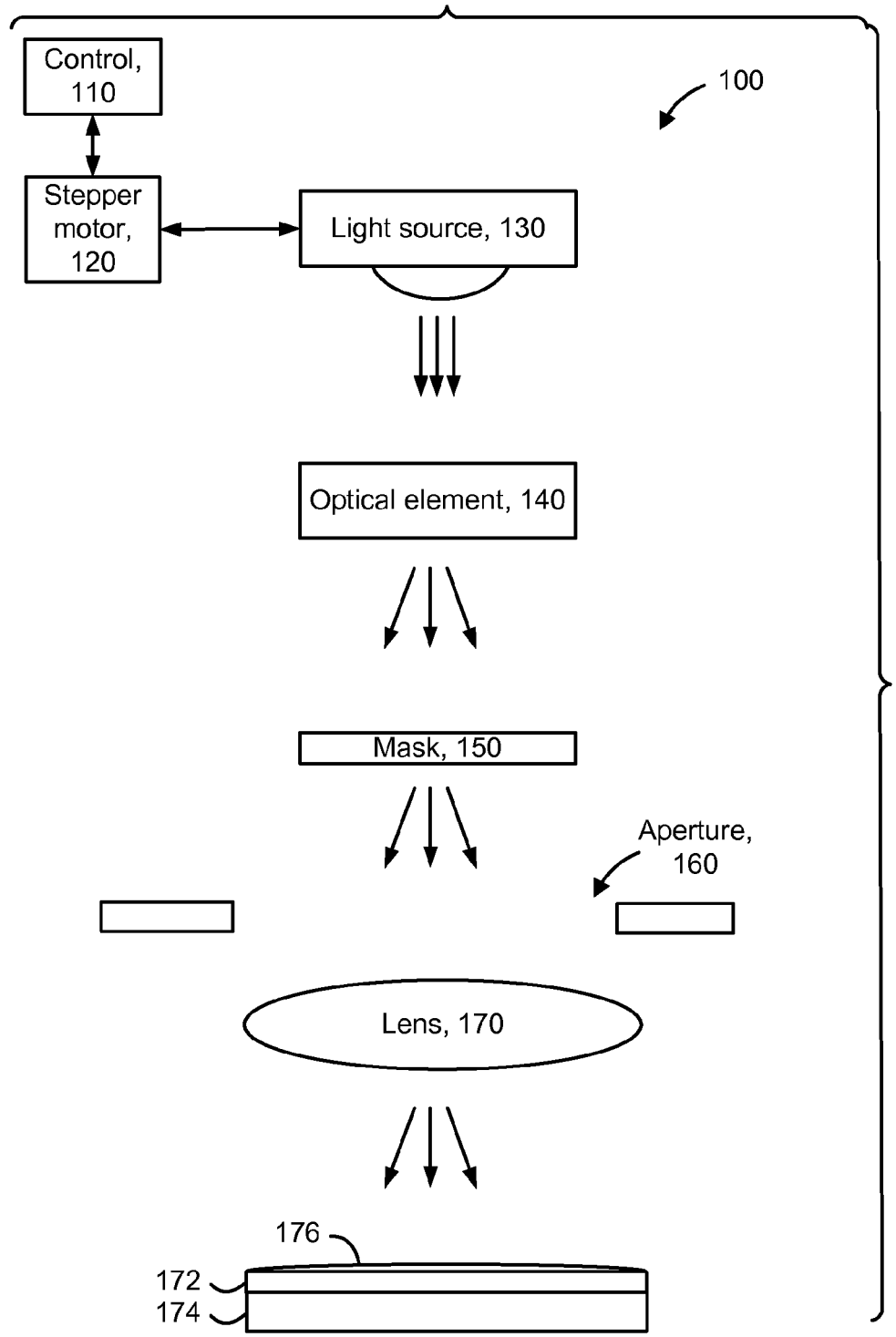
FIG. 1A depicts a photolithographic apparatus.

FIG. 1A depicts a photolithographic apparatus. The apparatus 100 includes a control 110, stepper motor 120, light source 130, optical element 140, mask 150, aperture 160 and projection lens 170. A pattern of the mask 150 is transferred to a photoresist film 172 on a substrate 174 such as a wafer.

Additional layers may be below the photoresist film 172, such as a wiring layer for a circuit. The photoresist film has a pre-determined thickness which is suitable for its intended application. In this simplified example, under control of the stepper motor 120, the light source 130 and optical element 140 move relative to the mask 150, while the photoresist film 172 is held in a fixed position in relation to the mask 150. In particular, the light source 130 and optical element 140 expose portions of the photoresist film 172 as they move across the pattern of the mask 150. The light source can be an Argon Fluoride (ArF) Excimer laser operating at $\lambda=193$ nm, for instance.

The lens 170 provides reduction optics which reduces the incident light beam to cause an exposure pattern on the photoresist film corresponding to a pattern on the mask 150. The mask 150 can be a chrome-less mask, chrome-on-glass mask or attenuating phase shifting mask, for example. The mask can be provided with a mask bias and phase angle which is optimum for its intended application.

Further, the photolithographic apparatus 100 may use immersion lithography. In one approach, water is dispensed between the lens 170 and the photoresist film 172, and surface tension results in a water puddle 176 on the photoresist film 172. Since the index of refraction of water is n>1 (e.g., 1.44 for deionized water), a numerical aperture (NA) of >1 can be achieved. The lens 170 in combination with the water puddle provide hyper-numerical aperture (NA>1) optics which can resolve a smaller feature width than the lens 170 in air. Specifically, we have the relation: feature size=$k1 \times \lambda/NA$, where k1 is the resolution factor. An NA of approximately 1.0-1.5 may be used, for instance. In other approaches, immersion optics are not used.

ArF immersion lithography has been used with a resolution limit of ~36 nm half-pitch, for instance.

To improve upon this result, spacer lithography can be used. In one approach, a single pattern (SP) spacer lithography is used to form 32 nm half-pitch and below patterns in mass production. A spacer is a film layer formed on the sidewall of a pre-patterned feature. A spacer is formed by deposition or reaction of the film on the previous pattern, followed by etching to remove all the film material on the horizontal surfaces, leaving only the material on the sidewalls as the sidewall spacer. By removing the original patterned feature, only the spacer is left. However, since there are two spacers for every line, the line density has now doubled. Such a spacer is referred to as a self-aligned spacer because it is aligned to the location of the sidewall of the pre-patterned feature.

However, single pattern spacer lithography is expected to reach its physical limit at around 19 nm half-pitch. Next Generation Lithography (NGL) technologies attempt to reach an even smaller resolution, and include extreme ultraviolet (EUV) lithography. However, the NGL technologies are still too immature to use in mass production.

Spacer double patterning lithography is a promising technique for achieving smaller resolution sizes. Spacer double patterning is, more generally, a type of multiple patterning in which at least first and second deposited patterns are used. For example, a first deposited pattern can be provided by a first masked photoresist deposition, followed by forming sidewall spacers of the first deposited pattern, followed by removal of the first deposited pattern to leave the sidewall spacers as freestanding, unattached structures in a corresponding pattern, followed by a second deposited pattern e.g., by a second masked photoresist deposition. The second deposited pattern combined with the pattern of the freestanding sidewall spacers form a pattern which is then transferred to one or more underlying layers.

However, many challenges are imposed by spacer double patterning, in terms of process complexity, process control and pattern formation. For example, formation of hook-up patterns is problematic. In some implementations of spacer double patterning lithography, one photoresist line is used to create four adjacent lines in a wiring layer of a semiconductor device. In some cases, the adjacent lines have equal widths and are equally spaced from one another (see FIG. 1B). The lines can be word line, bit lines, control gate select lines, other control lines or signal- or power-carrying lines, and so forth in a memory device such as flash memory or resistive RAM (ReRAM) memory, for instance. However, the spacer double patterning lithography is generally applicable to any type of semiconductor memory device or integrated circuit. Additionally, the techniques provided herein for spacer double patterning lithography can be extended to other types of multiple patterning, e.g., using three or more spacer patterns.

In the wiring layer, hook-up patterns or regions are locations on which vertically-extending conductive paths such as vias can be formed. These regions are wider than the lines to allow some tolerance in forming the vias and to accommodate the width of the via. Generally, a hook-up pad should be connected to a specified one of the lines without being connected to another of the lines, causing a short circuit failure in the device. However, with the very small feature width of the lines which is achieved by spacer double patterning lithography, there is little tolerance for error in connecting the hook-up pad to a line.

Figure 1B:
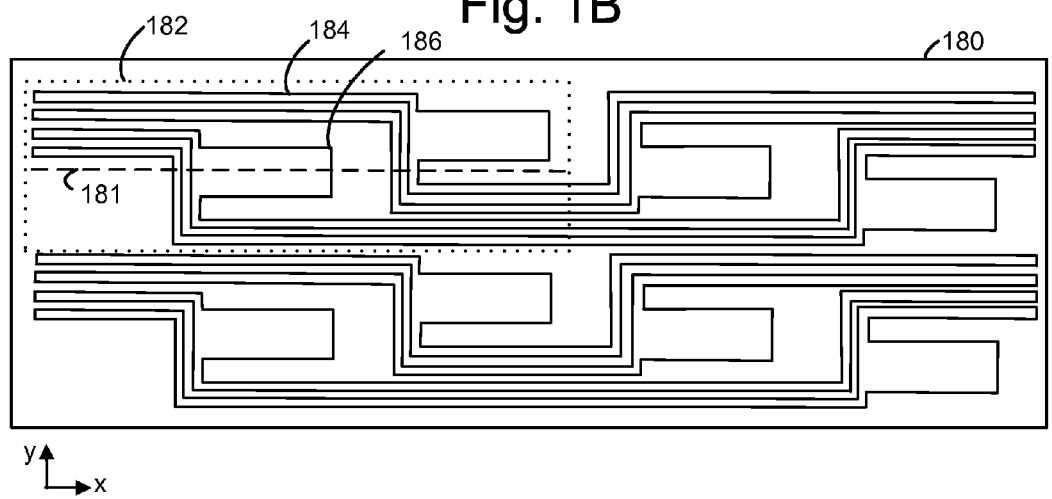
FIG. 1B depicts a top view of an example wiring layer which includes lines and hook-up pads.

FIG. 1B depicts a top view of an example wiring layer 180 which includes lines and hook-up pads. A pattern of lines and hook-up pads, such as example line 184 and hook-up pad 186, can repeat in x- and y-directions across the surface of the wiring layer. A wiring layer refers to a layer which will include conductive paths for carrying signals such as control and power signals in the completed semiconductor device.

In one approach, the wiring layer can be a thin film of metal such as Aluminum or Tungsten. In another approach, the wiring layer is formed by patterning an insulator layer such as Tetraethyl orthosilicate (TEOS) and copper is deposited using a Damascene process.

In another approach, the wiring layer is formed from a layer of polysilicon (poly-Si) which is metallized by the process of silicidation, after the layer is patterned by lithography. Metallization refers to a process for the formation of metal contacts and interconnects in the manufacturing of semiconductor devices. A metallization layer can be provide by silicidation, which is an anneal (sintering) process resulting in the formation of metal-Si alloy (silicide) to act as a contact. For example, sputtering of a metal such as Ni or Co on the polysilicon followed by silicidation annealing transforms the polysilicon layer to a silicide such as NiSi or $CoSi_2$. A silicide is an alloy of silicon and metal and has the advantages of metal contacts, such as significantly lower resistivity than poly-Si and the advantages of poly-Si such as no electromigration. Similarly, a silicidation process (self-aligned silicide process) is a process in which silicide contacts are formed only in those areas in which deposited metal (which after annealing becomes a metal component of the silicide) is in direct contact with silicon, hence, are self-aligned. This process can be used to form ohmic contacts to the source, drain, and poly-Si gate. A metallization layer can refer to a layer which will be, or which has been, metallized. The formation of a portion 182 of the example wiring layer 180 is depicted in detail in subsequent figures.

The lines in the wiring layer are conductive lines at the time they are patterned, when the wiring layer comprises a conductive material such as metal, or become conductive lines after they are patterned due to a process such as the Damascene process or silicidation. Similarly, the hook-up pads in the wiring layer are conductive pads at the time they are patterned, when the wiring layer comprises a conductive material such as metal, or become conductive pads after they are patterned due to a process such as the Damascene process or silicidation.

Moreover, in addition to forming lines and hook-up regions in a wiring layer, the techniques described herein can be used to pattern other materials in a semiconductor device, such as metals, insulators, poly-Si or a-Si (amorphous silicon).

Cross-sectional views along dashed line 181 are provided in FIGS. 3A, 4A, 5A, 6A, 7A, 8A, 9A, 10A, 11A, 12A, 13A, 14A, 15A, 16A and 16C.

Figure 1C:
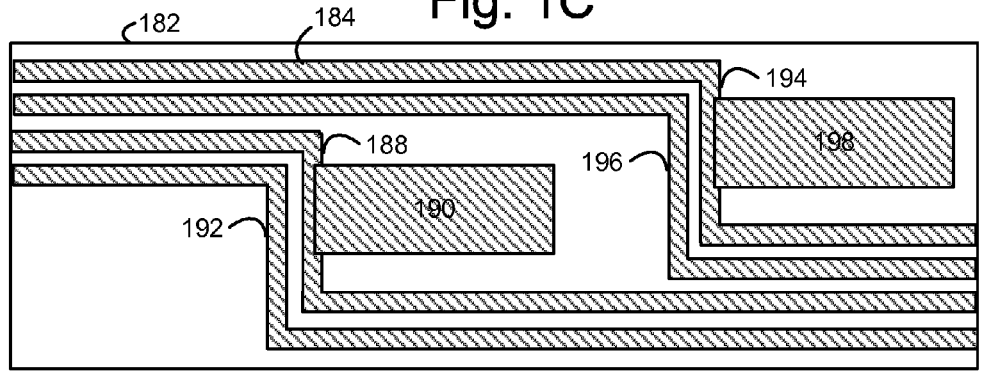
FIG. 1C depicts the portion 182 of the example wiring layer of FIG. 1B, showing hook-up pads which are properly connected to associated lines.

FIG. 1C depicts the portion 182 of the example wiring layer of FIG. 1B, showing hook-up pads which are properly connected to associated lines. For example, hook-up pads 190 and 198 are properly connected to associated lines 188 and 194, respectively, and are not short circuited to lines 192 and 196 which are adjacent to the associated lines 188 and 194, respectively.

Figure 1D:
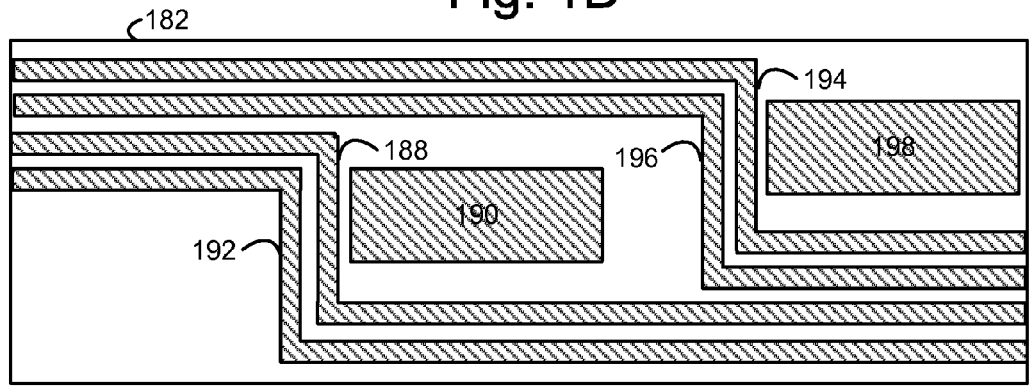
FIG. 1D depicts the portion 182 of the example wiring layer of FIG. 1B, showing hook-up pads which are not properly connected to associated lines.

FIG. 1D depicts the portion 182 of the example wiring layer of FIG. 1B, showing hook-up pads which are not properly connected to associated lines. For example, the hook-up pads 190 and 198 are not properly connected to the associated lines 188 and 194, respectively, due to respective gaps. This is an example of a misalignment between a hook-up pad and an associated line.

Figure 1E:
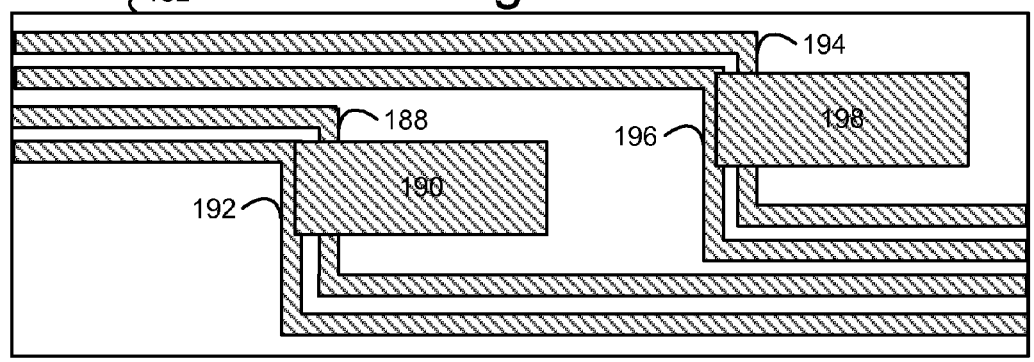
FIG. 1E depicts the portion 182 of the example wiring layer of FIG. 1B, showing hook-up pads which are not properly connected to associated lines.

FIG. 1E depicts the portion 182 of the example wiring layer of FIG. 1B, showing hook-up pads which are not properly connected to associated lines. For example, the hook up regions 190 and 198 are not properly connected to the associated lines 188 and 194, respectively, since they are short circuited to the lines 192 and 196, respectively. The lines 192 and 196 are adjacent to the associated lines 188 and 194, respectively. This is another example of a misalignment between a hook-up pad and an associated line. There is a very tight overlay budget which makes it difficult to properly connect a hook-up pad to an associated line or other line in general.

FIG. 2 depicts an example photolithographic method for fabricating a pattern which includes a line and a hook-up pad in a semiconductor device. Step 200 provides a layered semiconductor device with a substrate, wiring layer, hard mask layer, second sacrificial layer, first sacrificial layer and first photoresist layer (see FIG. 3A). Step 202 performs a first lithography step to pattern the first photoresist layer (see FIG. 4A).

Photolithography generally involves a number of steps, including surface preparation, which can include wafer cleaning and priming, coating the wafer with the photoresist such as by spin coating, and a pre-exposure bake (soft bake) which is used to evaporate the coating solvent and to densify the resist after spin coating. Other steps include alignment of the mask to the substrate, exposure of the photoresist, post-exposure bake of the photoresist, and development of the photoresist in which the photoresist is washed in a development solution which removes exposed areas of the photoresist (for a positive photoresist) or unexposed areas of the photoresist (for a negative photoresist). A post-exposure bake can be used to activate a chemically amplified reaction in the exposed area. A post-development hard bake is used to stabilize and harden the developed photoresist, after which processing using the photoresist as a masking film is performed to transfer the pattern of the mask to the substrate below the photoresist.

Figure 5A:
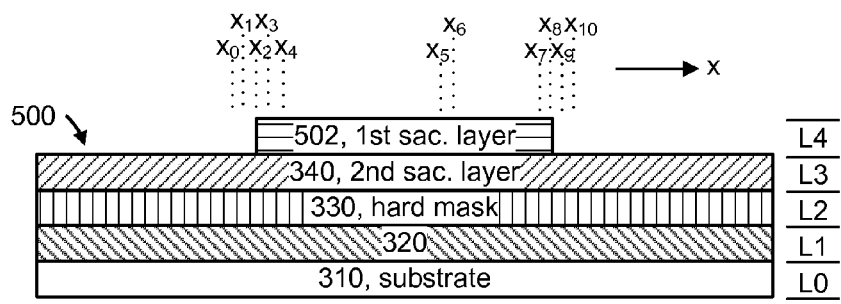
FIG. 5A depicts a cross-sectional view of the layered semiconductor material of FIG. 4A after performing step 204 of FIG. 2.

Step 204 transfers the pattern of the first photoresist layer to the first sacrificial layer, e.g., using reactive ion etching of the first sacrificial layer, to provide a patterned, first sacrificial layer (see FIG. 5A). Related steps include stripping the photoresist from the substrate and post processing cleaning.

Figure 6A:
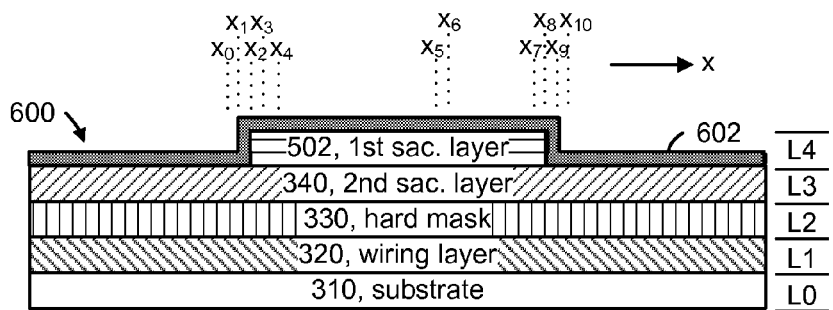
FIG. 6A depicts a cross-sectional view of the layered semiconductor material of FIG. 5A after performing step 206 of FIG. 2.

Step 206 deposits a first conformal, blanket spacer layer on the patterned, first sacrificial layer (see FIG. 6A). Step 208 performs reactive ion etching of the first conformal spacer layer to provide sidewall spacers of the patterned, first sacrificial layer (see FIG. 7A).

Figure 8A:
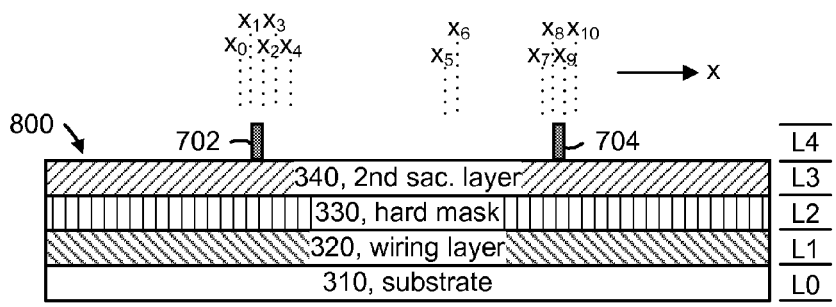
FIG. 8A depicts a cross-sectional view of the layered semiconductor material of FIG. 7A after performing step 210 of FIG. 2.

Step 210 performs a wet etch of the patterned, first sacrificial layer, causing the sidewall spacers to remain as free-standing structures (see FIG. 8A). The previous steps constitute single patterning lithography. Additional steps are then performed to provide double patterning lithography.

Figure 9A:
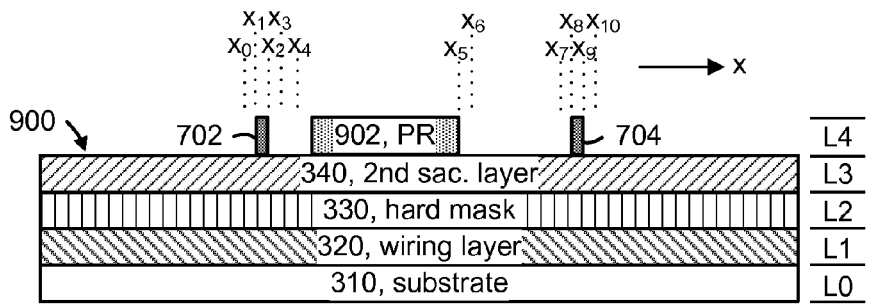
FIG. 9A depicts a cross-sectional view of the layered semiconductor material of FIG. 8A after performing step 212 of FIG. 2.

Step 212 performs a second lithography step to deposit a patterned photoresist structure on the second sacrificial layer (see FIG. 9A). Step 214 transfers the pattern of the spacers and the photoresist to the second sacrificial layer, using reactive ion etching of the second sacrificial layer, to provide a patterned, second sacrificial layer having at least first and second portions (see FIG. 10A). Optionally, there is a third portion, or additional portions, as well. Related steps include stripping the photoresist from the substrate and post processing cleaning.

Figure 11A:
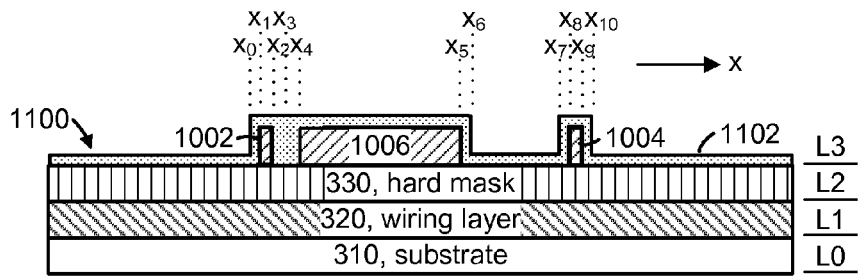
FIG. 11A depicts a cross-sectional view of the layered semiconductor material of FIG. 10A after performing step 216 of FIG. 2.

Step 216 deposits a second conformal spacer layer on the patterned, second sacrificial layer (see FIG. 11A). Step 218 performs reactive ion etching of the second conformal spacer layer to provide a sidewall spacer of the first portion of the second sacrificial layer, a sidewall spacer of the second portion of the second sacrificial layer, and a spanning region of the second conformal spacer layer which spans between the first portion of the second sacrificial layer and the second portion of the second sacrificial layer (see FIG. 12A). Optionally, the reactive ion etching provides sidewall spacers of the third portion. Step 220 performs a third lithography step to deposit a cover layer over the second portion of the second sacrificial layer (see FIG. 13A). Step 222 performs a wet etch to etch away the first (uncovered) portion, causing the sidewall spacer of the first portion of the second sacrificial layer to become an additional freestanding structure, and forming a gap between the additional freestanding structure and the spanning region of the second conformal spacer layer (see FIG. 14A). Optionally, the sidewall spacers of the third portion of the second sacrificial layer become additional freestanding structures. The cover layer 1302 is also removed.

Figure 15A:
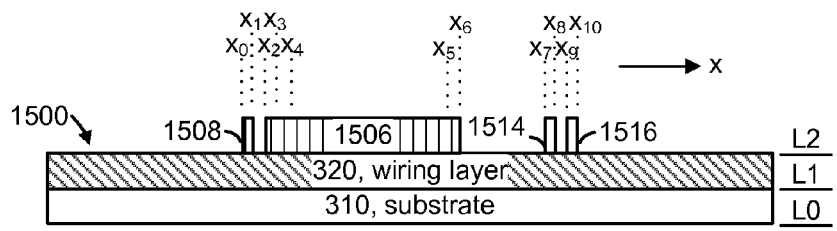
FIG. 15A depicts a cross-sectional view of the layered semiconductor material of FIG. 14A after performing step 224 of FIG. 2.

Step 224 transfers a pattern formed by the additional freestanding structure and a combination of the spanning region of the second conformal spacer layer, the second portion of the second sacrificial layer and the sidewall spacer of the second portion of the second sacrificial layer (and, optionally, the sidewall spacers of the third portion) to a hard mask layer, using reactive ion etching (see FIG. 15A). Step 226 transfers a pattern of the patterned hard mask layer to the wiring layer, using etching such as reactive ion etching (see FIG. 16A). Optionally, step 227 is used to perform metallization or a Damascene process for the wiring layer. Step 228 deposits insulating material on the substrate and the patterned wiring layer, etches one or more holes to one or more hook-up pads of the patterned wiring layer, and deposits conductive material in the one or more holes (see FIG. 16C). This allows conductive connections to be made from the wiring layer to circuitry above the wiring layer in the semiconductor device.

Figure 3A:
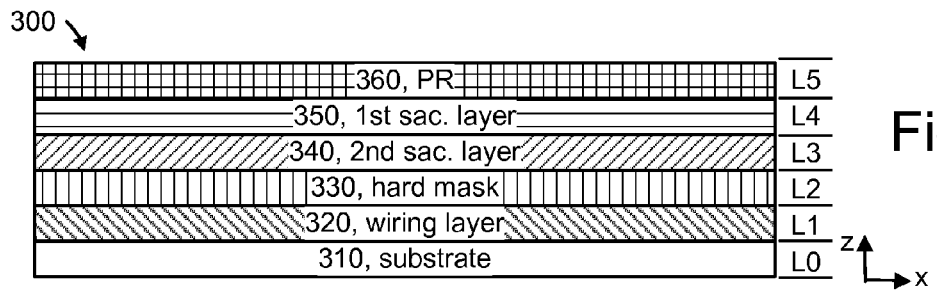
FIG. 3A depicts a cross-sectional view of an initial configuration of a layered semiconductor material for a semiconductor device.

FIG. 3A depicts a cross-sectional view of an initial configuration of a layered semiconductor material for a semiconductor device. In FIGS. 3A, 4A, 5A, 6A, 7A, 8A, 9A, 10A, 11A, 12A, 13A, 14A, 15A, 16A and 16C, different levels are represented by L0, L1, L2, L3, L4 and L5 (layers 0-5, respectively) for explanation purposes. This does not indicate that these are necessarily the only levels in the semiconductor device. As the figures are not to scale, the heights of the layers are not necessarily equal or in the proportions shown. The layers have a pre-determined thickness which is suitable for an intended application. The layers can include films. Moreover, a given level can comprise one or more layers. Also, the cross-sectional views are along the line 181, as mentioned. The different regions of the layered semiconductor material have patterns which are used consistently in FIGS. 3A, 4A, 5A, 6A, 7A, 8A, 9A, 10A, 11A, 12A, 13A, 14A, 15A, 16A and 16C to facilitate understanding.

In the layered semiconductor material 300, L0 comprises a substrate 310, e.g., any semiconducting substrate, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein. L1 comprises a wiring layer 320, e.g., a thin film of metal such as copper, which is ultimately patterned to include lines and hook-up pads as discussed. L2 comprises a hard mask layer 330 which is suitable for patterning the wiring layer. A hard mask can be dielectric or metallic. A dielectric hard mask can be an organic hard mask layer comprising, e.g., amorphous carbon, such as Advanced Patterning Film (APF), available from Applied Materials Inc., Santa Clara, Calif. A dielectric hard mask can be an oxide hard mask such as silicon oxide ($SiO_2$), or a nitride hard mask such as silicon nitride (SiN). Another example is silicon-oxynitride (SiON). An example of a metallic hard mask is Titanium nitride (TiN). The hard mask layer is used as an etch mask for the wiring layer. The thickness of the hard mask layer can vary and generally be determined by the requirements of etching steps in a particular process.

L4 and L3 comprise first and second sacrificial layers, 350 and 340, respectively, e.g., insulating sacrificial layers such as silicon nitride, magnesium oxide, silicon nitride, silicon, or a silicide. Examples of a metal silicide include titanium silicide, nickel silicide, or tungsten silicide. If titanium silicide is used, it can be formed by depositing a thin layer of silicon, followed by a thin layer of titanium and a subsequent anneal.

L5 comprises a first deposited layer of a light-sensitive positive or negative photoresist 360.

Figure 3B:
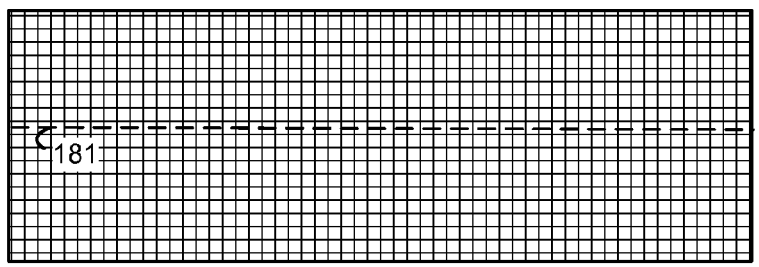
FIG. 3B depicts a top view of the layered semiconductor material of FIG. 3A.

FIG. 3B depicts a top view of the layered semiconductor material of FIG. 3A, showing the photoresist 360.

Figure 4A:
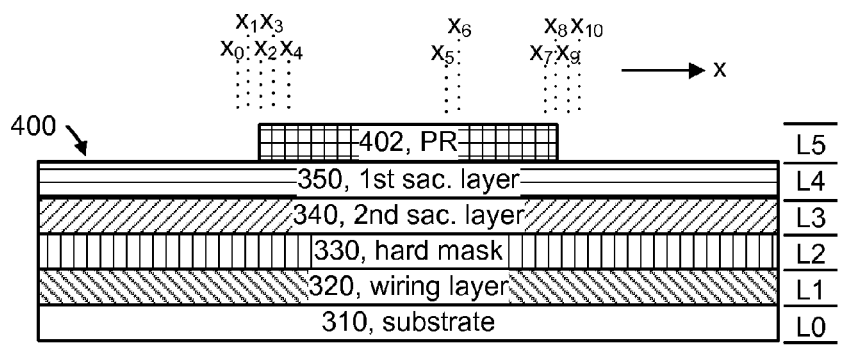
FIG. 4A depicts a cross-sectional view of the layered semiconductor material of FIG. 3A after performing step 202 of FIG. 2.

FIG. 4A depicts a cross-sectional view of the layered semiconductor material of FIG. 3A after performing step 202 of FIG. 2. A layered semiconductor material 400 is formed. Step 202 performs a first lithography step to pattern the first photoresist layer 360, resulting in a patterned photoresist layer 402 from $x_2$-$x_8$ at L5. The lithography includes etching down to a top surface of L4.

Distance metrics $x_0$-$x_{10}$ along an x-axis are provided for reference consistently in this and many of the remaining figures. The distance marks are sequential but not necessarily equidistant.

Figure 4B:
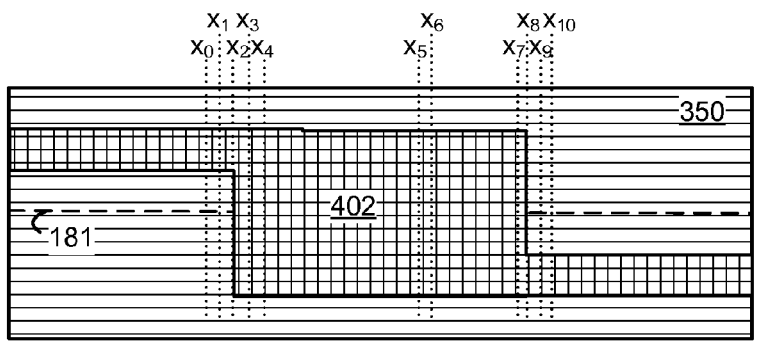
FIG. 4B depicts a top view of the layered semiconductor material of FIG. 4A.

FIG. 4B depicts a top view of the layered semiconductor material of FIG. 4A, showing the first sacrificial layer 350 and the patterned photoresist layer 402.

FIG. 5A depicts a cross-sectional view of the layered semiconductor material of FIG. 4A after performing step 204 of FIG. 2. A layered semiconductor material 500 is formed. Step 204 transfers the pattern of the first photoresist layer 402 to the first sacrificial layer 350 at L4, using reactive ion etching of the first sacrificial layer, to provide a patterned, first sacrificial layer 502 from $x_2$-$x_8$ at L4. The process includes etching down to a top surface of L3.

Figure 5B:
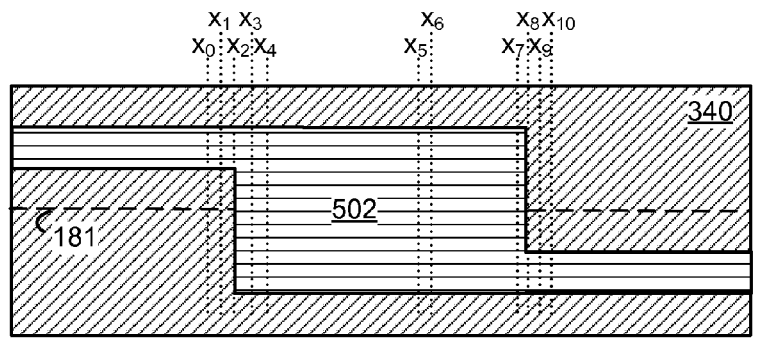
FIG. 5B depicts a top view of the layered semiconductor material of FIG. 5A.

FIG. 5B depicts a top view of the layered semiconductor material of FIG. 5A, showing the second sacrificial layer 340 and the patterned, first sacrificial layer 502. Note the corresponding extent from $x_2$-$x_8$ along the dashed line 181.

FIG. 6A depicts a cross-sectional view of the layered semiconductor material of FIG. 5A after performing step 206 of FIG. 2. A layered semiconductor material 600 is formed. Step 206 deposits a first conformal spacer layer 602 on the patterned, first sacrificial layer 502, as well as on exposed portions of the second sacrificial layer 340, as a blanket deposition at L4. The spacer layers can be a dielectric material such as silicon nitride (SiN) or silicon oxide ($SiO_2$). Spacer materials can be the same as hard mask materials, in some cases.

Figure 6B:
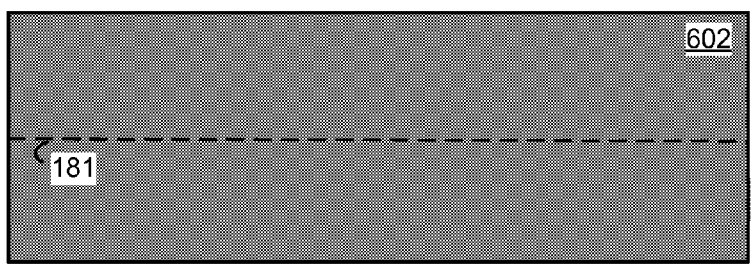
FIG. 6B depicts a top view of the layered semiconductor material of FIG. 6A.

FIG. 6B depicts a top view of the layered semiconductor material of FIG. 6A, showing the first conformal spacer layer 602.

Figure 7A:
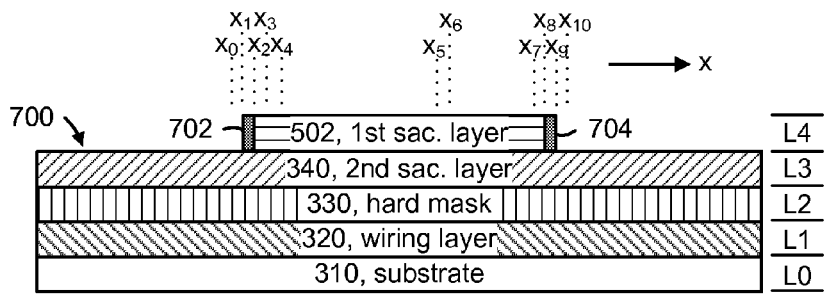
FIG. 7A depicts a cross-sectional view of the layered semiconductor material of FIG. 6A after performing step 208 of FIG. 2.

FIG. 7A depicts a cross-sectional view of the layered semiconductor material of FIG. 6A after performing step 208 of FIG. 2. A layered semiconductor material 700 is formed. Step 208 performs reactive ion etching of the first conformal spacer layer to provide sidewall spacers 702 (from $x_1$-$x_2$) and 704 (from $x_8$-$x_9$) of the patterned, first sacrificial layer 502. The sidewall spacers are adjacent to sides of the first sacrificial layer in the layered semiconductor material 700. The process includes etching down to a top surface of L3, laterally of the patterned, first sacrificial layer 502, and etching down to a top surface of the patterned, first sacrificial layer 502.

Figure 7B:
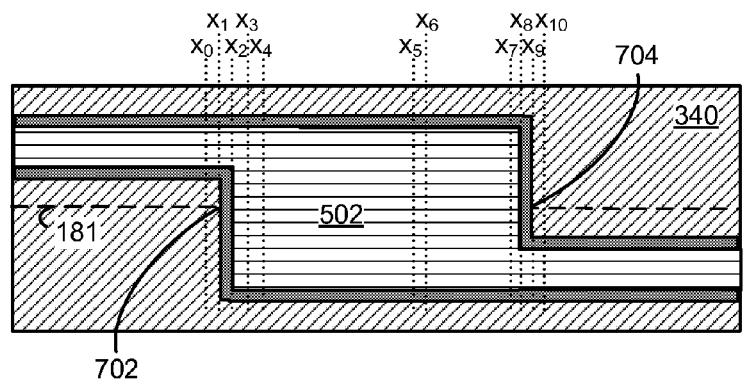
FIG. 7B depicts a top view of the layered semiconductor material of FIG. 7A.

FIG. 7B depicts a top view of the layered semiconductor material of FIG. 7A, showing the second sacrificial layer 340, the patterned, first sacrificial layer 502, and the sidewall spacers 702 and 704.

FIG. 8A depicts a cross-sectional view of the layered semiconductor material of FIG. 7A after performing step 210 of FIG. 2. A layered semiconductor material 800 is formed. Step 210 performs a wet etch of the patterned, first sacrificial layer 502, causing the sidewall spacers 702 and 704 to become freestanding structures in a first set of freestanding structures at L4. That is, the sidewall spacers 702 and 704 are no longer in contact with sides of the first sacrificial layer 502. The process includes etching down to a top surface of L3.

Figure 8B:
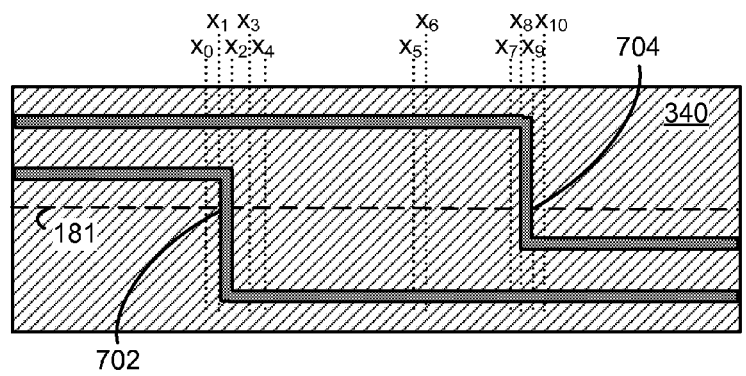
FIG. 8B depicts a top view of the layered semiconductor material of FIG. 8A.

FIG. 8B depicts a top view of the layered semiconductor material of FIG. 8A, showing the second sacrificial layer 340 and the sidewall spacers 702 and 704.

FIG. 9A depicts a cross-sectional view of the layered semiconductor material of FIG. 8A after performing step 212 of FIG. 2. A layered semiconductor material 900 is formed. Step 212 performs a second lithography step to deposit a patterned photoresist structure 902 on the second sacrificial layer (see FIG. 9A). The extent of the photoresist structure 902 is $x_4$-$x_5$. The photoresist structure 902 is used to form a hook-up pad.

Figure 9B:
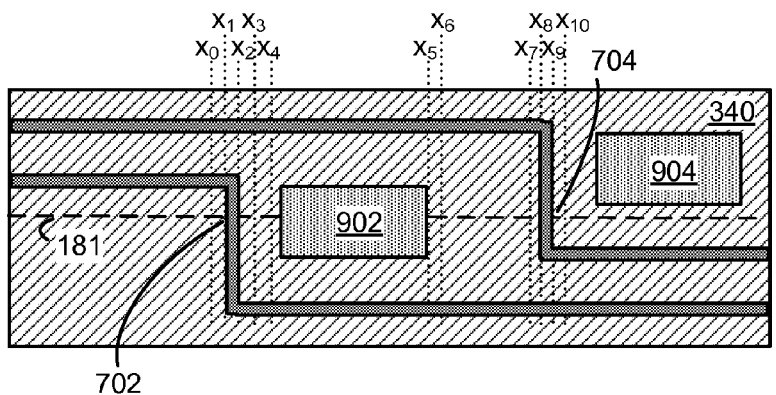
FIG. 9B depicts a top view of the layered semiconductor material of FIG. 9A.

FIG. 9B depicts a top view of the layered semiconductor material of FIG. 9A, showing the second sacrificial layer 340, the sidewall spacers 702 and 704, and photoresist structures 902 and 904 (904 is not seen in FIG. 9A since it is not along the line 181).

Figure 10A:
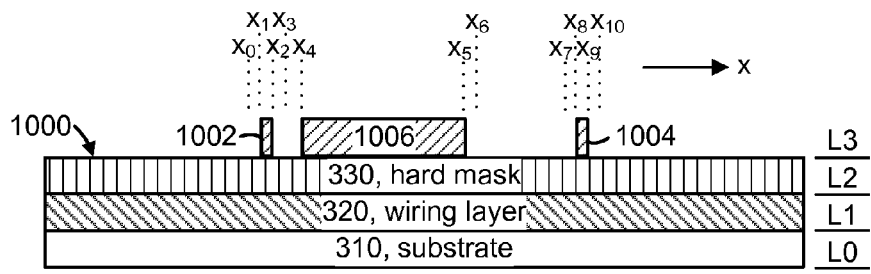
FIG. 10A depicts a cross-sectional view of the layered semiconductor material of FIG. 9A after performing step 214 of FIG. 2.

FIG. 10A depicts a cross-sectional view of the layered semiconductor material of FIG. 9A after performing step 214 of FIG. 2. A layered semiconductor material 1000 is formed. Step 214 transfers the pattern of the spacers and the photoresist to the second sacrificial layer, using reactive ion etching of the second sacrificial layer, to provide a patterned, second sacrificial layer (L3) having at least first 1002 and second 1006 portions. Optionally, there is also a third portion 1004 of the second sacrificial layer. The extent of the first, second and third portions of the second sacrificial layer is $x_1$-$x_2$, $x_4$-$x_5$ and $x_8$-$x_9$, respectively. The process includes etching down to a top surface of L2.

Figure 10B:
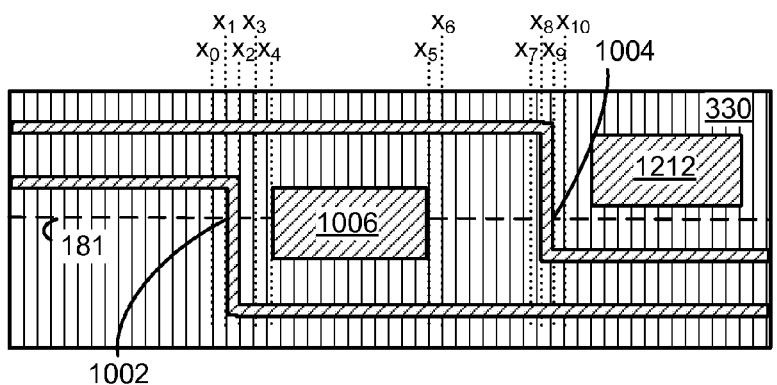
FIG. 10B depicts a top view of the layered semiconductor material of FIG. 10A.

FIG. 10B depicts a top view of the layered semiconductor material of FIG. 10A, showing the hard mask layer 330, the first 1002 and second 1006 portions of the second sacrificial layer, and a corresponding additional portion 1212 of the second sacrificial layer (1212 is not seen in FIG. 10A since it is not along the line 181).

FIG. 11A depicts a cross-sectional view of the layered semiconductor material of FIG. 10A after performing step 216 of FIG. 2. A layered semiconductor material 1100 is formed. Step 216 deposits a second conformal spacer layer 1102 on the patterned, second sacrificial layer.

Figure 11B:
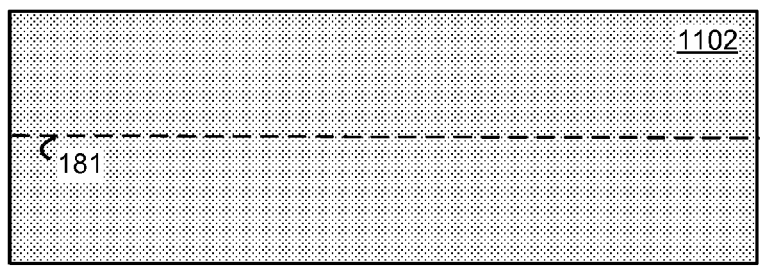
FIG. 11B depicts a top view of the layered semiconductor material of FIG. 11A.

FIG. 11B depicts a top view of the layered semiconductor material of FIG. 11A, showing the second conformal spacer layer 1102.

Figure 12A:
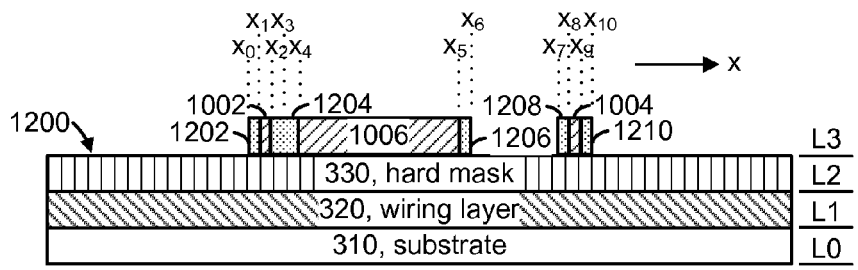
FIG. 12A depicts a cross-sectional view of the layered semiconductor material of FIG. 11A after performing step 218 of FIG. 2.

FIG. 12A depicts a cross-sectional view of the layered semiconductor material of FIG. 11A after performing step 218 of FIG. 2. A layered semiconductor material 1200 is formed. Step 218 performs reactive ion etching of the second conformal spacer layer to provide a sidewall spacer 1202 of the first portion 1002 of the second sacrificial layer, a sidewall spacer 1206 of the second portion 1006 of the second sacrificial layer, and a spanning region 1204 of the second conformal spacer layer which spans between the first portion 1002 and the second portion 1006. That is, the spanning region 1204 of the second conformal spacer layer spans a space between the first portion 1002 and the second portion 1006, contacting a side of the first portion 1002 and a side of the second portion 1006, where the sides are opposing. The spanning region 1204 may have a width from $x_2$-$x_4$ which is about the width of one to two spacers, for example. The third portion 1004 of the second sacrificial layer had sidewall portions 1208 and 1210. The process includes etching down to a top surface of L2, and to top surfaces of portions 1002, 1006 and 1004. The spanning region 1204 may be referred to as a sidewall layer region.

The extent along the x-axis of the sidewall spacer 1202 is $x_0$-$x_1$. The extent along the x-axis of the first portion of the second sacrificial layer 1002 is $x_1$-$x_2$. The extent along the x-axis of the spanning region 1204 is $x_2$-$x_4$. The extent along the x-axis of the second portion of the second sacrificial layer is $x_4$-$x_5$. The extent along the x-axis of the sidewall spacer 1206 is $x_5$-$x_6$. The extent along the x-axis of the sidewall spacer 1208 is $x_7$-$x_8$. The extent along the x-axis of the third portion 1004 of the second sacrificial layer is $x_8$-$x_9$. The extent along the x-axis of the sidewall spacer 1210 is $x_9$-$x_{10}$. This process allows the resulting hook-up pad and line to be "self-connected" so that process control issues are reduced.

The sidewall spacer 1202 has a pattern which is transferred to a line, so that the line can have a width which is less than the half-pitch of the lithography. The sidewall spacer 1202 and the line it patterns will have corresponding widths, e.g., in the x-direction.

A gap 1402 (FIG. 14A) will similarly be patterned by the sidewall spacer 702 (via first portion 1002 of the second sacrificial layer) so that the gap can have a width which is less than the half-pitch of the lithography. The gap 1402 results in a corresponding gap between the hook-up pad and the associated line.

The sidewall spacers 1208 and 1210 will pattern corresponding lines having corresponding widths, e.g., in the x-direction as the sidewall spacers.

Figure 12B:
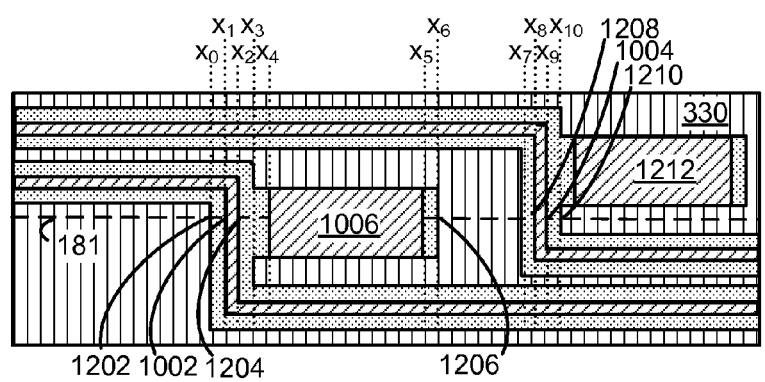
FIG. 12B depicts a top view of the layered semiconductor material of FIG. 12A.

FIG. 12B depicts a top view of the layered semiconductor material of FIG. 12A, showing the hard mask layer 330, sidewall spacers 1202, 1206, 1208 and 1210, spanning region 1204, first portion 1002 of the second sacrificial layer, second portion 1006 of the second sacrificial layer, and additional region 1212 (1212 is not seen in FIG. 12A since it is not along the line 181).

Figure 13A:
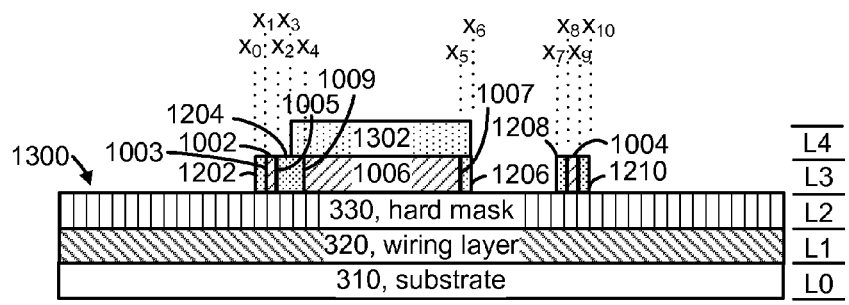
FIG. 13A depicts a cross-sectional view of the layered semiconductor material of FIG. 12A after performing step 220 of FIG. 2.

FIG. 13A depicts a cross-sectional view of the layered semiconductor material of FIG. 12A after performing step 220 of FIG. 2. A layered semiconductor material 1300 is formed.

Optionally, the reactive ion etching also provides sidewall spacers of the third portion 1004 of the second sacrificial layer. Step 220 performs a third lithography step to deposit a cover layer 1302 over the second portion 1006 of the second sacrificial layer (see FIG. 13A). The cover layer can comprise a material such as photoresist which protects the second portion 1006 of the second sacrificial layer in a subsequent wet etch process. In particular, the cover layer extends sufficiently laterally to provide some margin in protecting the second portion of the second sacrificial layer 1006. For example, the cover layer extends at one end to $x_3$, past $x_4$ and at the other end to $x_6$, past $x_5$. The cover layer does not cover the first portion 1002 of the second sacrificial layer. Thus, the left hand edge of the cover layer 1302 is between the right hand edge of the first portion 1002 and the left hand edge of the second portion 1006. The right hand edge of the cover layer 1302 is to the right of the right hand edge of the second portion 1006.

Figure 13B:
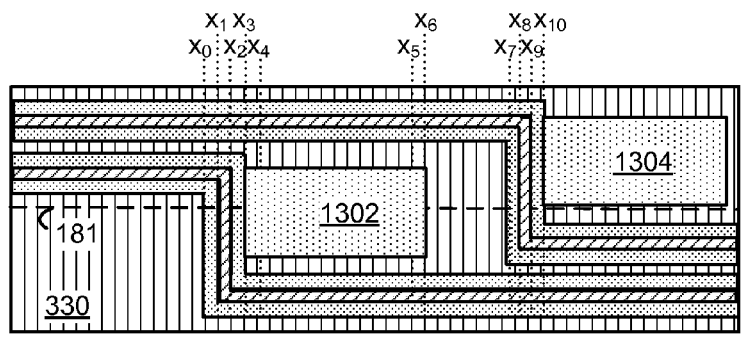
FIG. 13B depicts a top view of the layered semiconductor material of FIG. 13A.

FIG. 13B depicts a top view of the layered semiconductor material of FIG. 13A, showing the hard mask region 330, the cover layer 1302 and an additional cover layer 1304 (1304 is not seen in FIG. 13A since it is not along the line 181).

Figure 14A:
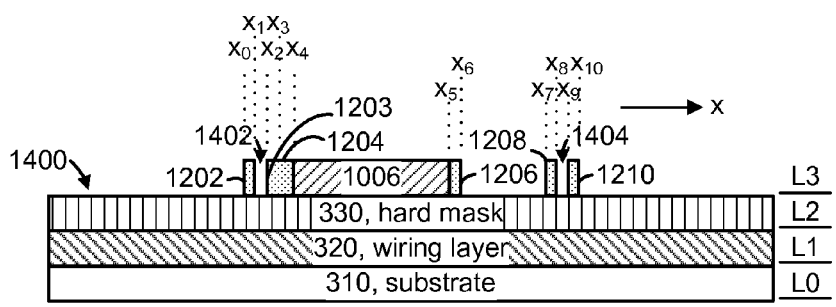
FIG. 14A depicts a cross-sectional view of the layered semiconductor material of FIG. 13A after performing step 222 of FIG. 2.

FIG. 14A depicts a cross-sectional view of the layered semiconductor material of FIG. 13A after performing step 222 of FIG. 2. A layered semiconductor material 1400 is formed.

Step 222 performs a wet etch to etch away the first (uncovered) portion 1002 of the second sacrificial layer, causing the sidewall spacer 1202 of the first portion of the second sacrificial layer to become an additional freestanding structure in a second, additional set of freestanding structures, and forming a gap 1402 between the additional freestanding structure 1202 and the spanning region 1204 of the second conformal spacer layer (see FIG. 14A). Optionally, the sidewall spacers 1208 and 1210 of the third portion 1004 of the second sacrificial layer become additional freestanding structures in the second, additional set of freestanding structures when the third portion 1004 of the second sacrificial layer is etched away by the wet etch, leaving a gap 1404. The extent along the x-axis of the gap 1402 is $x_1$-$x_2$. The extent along the x-axis of the gap 1404 is $x_8$-$x_9$. The process includes etching down to a top surface of L2.

Thus, the etching away exposes a gap 1402 between the additional freestanding structure 1202 and the spanning region 1204 of the second spacer layer, which defines a corresponding gap between the line and the hook-up pad. The gap spans the additional freestanding structure 1202 and a side 1203 of the spanning region 1204 of the second spacer layer which faces the additional freestanding structure.

Further, the first portion 1002 of the second sacrificial layer has a first side 1003 facing away from the second portion 1006 of the second sacrificial layer, and a second side 1005 facing the second portion 1006 of the second sacrificial layer. The sidewall spacer 1202 of the first portion 1002 of the second sacrificial layer is adjacent to the first side 1003 of the first portion 1002 of the second sacrificial layer. The second portion 1006 of the second sacrificial layer has a first side 1007 facing away from the first portion 1002 of the second sacrificial layer, and a second side 1009 facing the first portion 1002 of the second sacrificial layer. The sidewall spacer 1206 of the second portion 1006 of the second sacrificial layer is adjacent to the first side 1007 of the second portion 1006 of the second sacrificial layer.

Figure 14B:
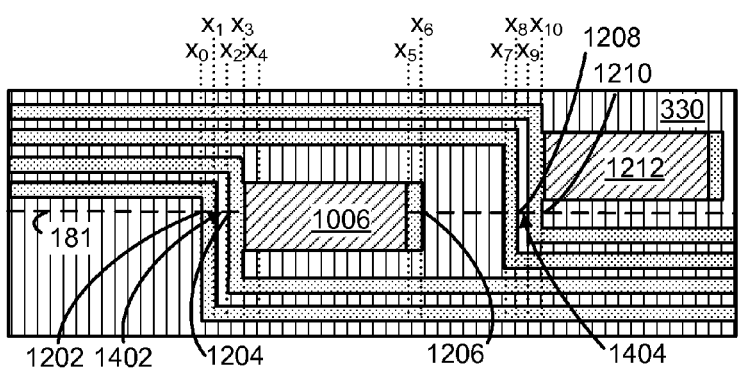
FIG. 14B depicts a top view of the layered semiconductor material of FIG. 14A.

FIG. 14B depicts a top view of the layered semiconductor material of FIG. 14A, showing the hard mask layer 330, the sidewall spacers 1202, 206, 1208 and 1201, the spanning region 1204, the gaps 1402 and 1404, the second portion 1006 of the second sacrificial layer and the corresponding additional portion 1212 of the second sacrificial layer (1212 is not seen in FIG. 14A since it is not along the line 181).

FIG. 15A depicts a cross-sectional view of the layered semiconductor material of FIG. 14A after performing step 224 of FIG. 2. A layered semiconductor material 1500 is formed.

Step 224 transfers a pattern formed by the additional freestanding structure 1202 and a combination of the spanning region 1204 of the second conformal spacer layer, the second portion 1006 of the second sacrificial layer and the sidewall spacer 1206 of the second portion of the second sacrificial layer to a hard mask layer 330, using reactive ion etching (see FIG. 15A). Optionally, the transferred pattern is also formed by the sidewall spacers 1208 and 1210 of the third portion 1004 of the second sacrificial layer. This result in a pattern in L2 comprised of hard mask portions 1508 (from $x_0$-$x_1$), 1506 (from $x_2$-$x_6$), 1514 (from $x_8$-$x_7$) and 1516 (from $x_{10}$-$x_9$).

Figure 15B:
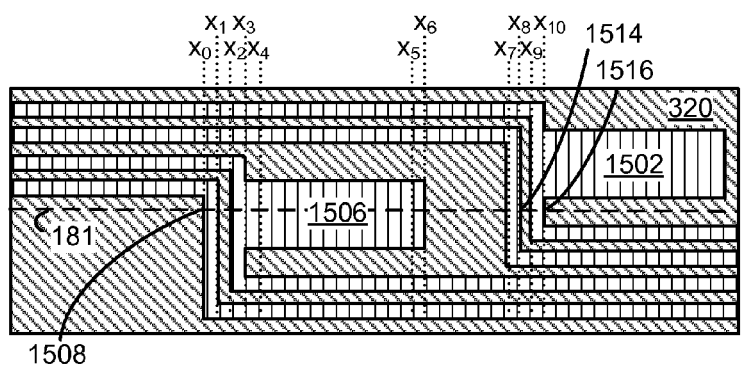
FIG. 15B depicts a top view of the layered semiconductor material of FIG. 15A.

FIG. 15B depicts a top view of the layered semiconductor material of FIG. 15A, showing the wiring layer 320, the hard mask portions 1506, 1508, 1514 and 1516 and an additional hard mask portion 1502 which is not seen in FIG. 15A since it is not along the line 181.

Figure 16A:
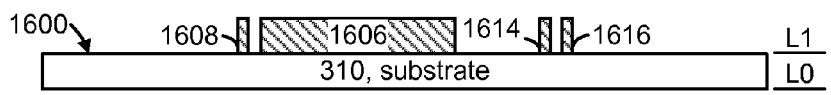
FIG. 16A depicts a cross-sectional view of the layered semiconductor material of FIG. 15A after performing step 226 of FIG. 2.

FIG. 16A depicts a cross-sectional view of the layered semiconductor material of FIG. 15A after performing step 226 of FIG. 2. A layered semiconductor material 1600 is formed. Step 226 transfers a pattern of the patterned hard mask layer at L3 to the wiring layer at L2, using etching (see FIG. 16A). This result in a pattern in L1 comprised of wiring layer portions 1608, 1606, 1614 and 1616, corresponding to hard mask portions 1508, 1506, 1514 and 1516, respectively, of FIG. 15A.

Figure 16B:
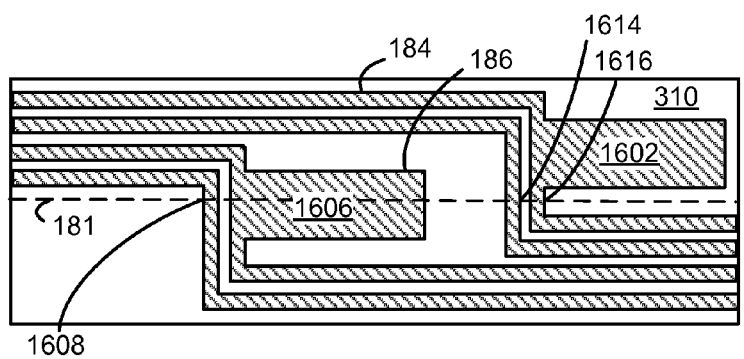
FIG. 16B depicts a top view of the layered semiconductor material of FIG. 16A.

FIG. 16B depicts a top view of the layered semiconductor material of FIG. 16A, showing the substrate 310, wiring layer portions 1606, 1608, 1614 and 1616 and an additional wiring layer portion 1602 which is not seen in FIG. 16A since it is not along the line 181.

Figure 16C:
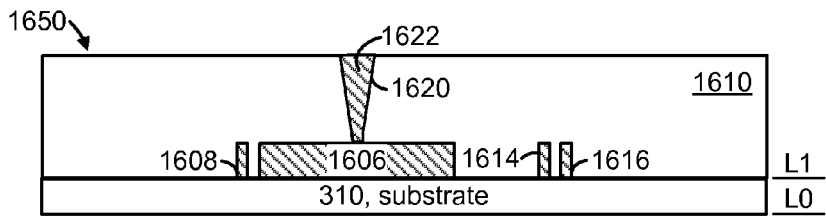
FIG. 16C depicts a cross-sectional view of the layered semiconductor material of FIG. 16A after performing step 228 of FIG. 2.

FIG. 16C depicts a cross-sectional view of the layered semiconductor material of FIG. 16A after performing step 228 of FIG. 2. A layered semiconductor material 1650 is formed. Step 228 deposits insulating material such as TEOS 1610 on the substrate 310 and the patterned wiring layer (comprised of wiring layer portions 1608, 1606, 1614 and 1616), etches one or more holes 1620 to one or more hook-up pads 1606 of the patterned wiring layer, and deposits conductive material 1622 in the one or more holes 1620 to provide a via or contact. This allows conductive connections to be made from the wiring layer L1 to circuitry above the wiring layer in the semiconductor device. The hook-up pad 160 is a landing pad for the vertically-extending contact 1622.

Figure 17:
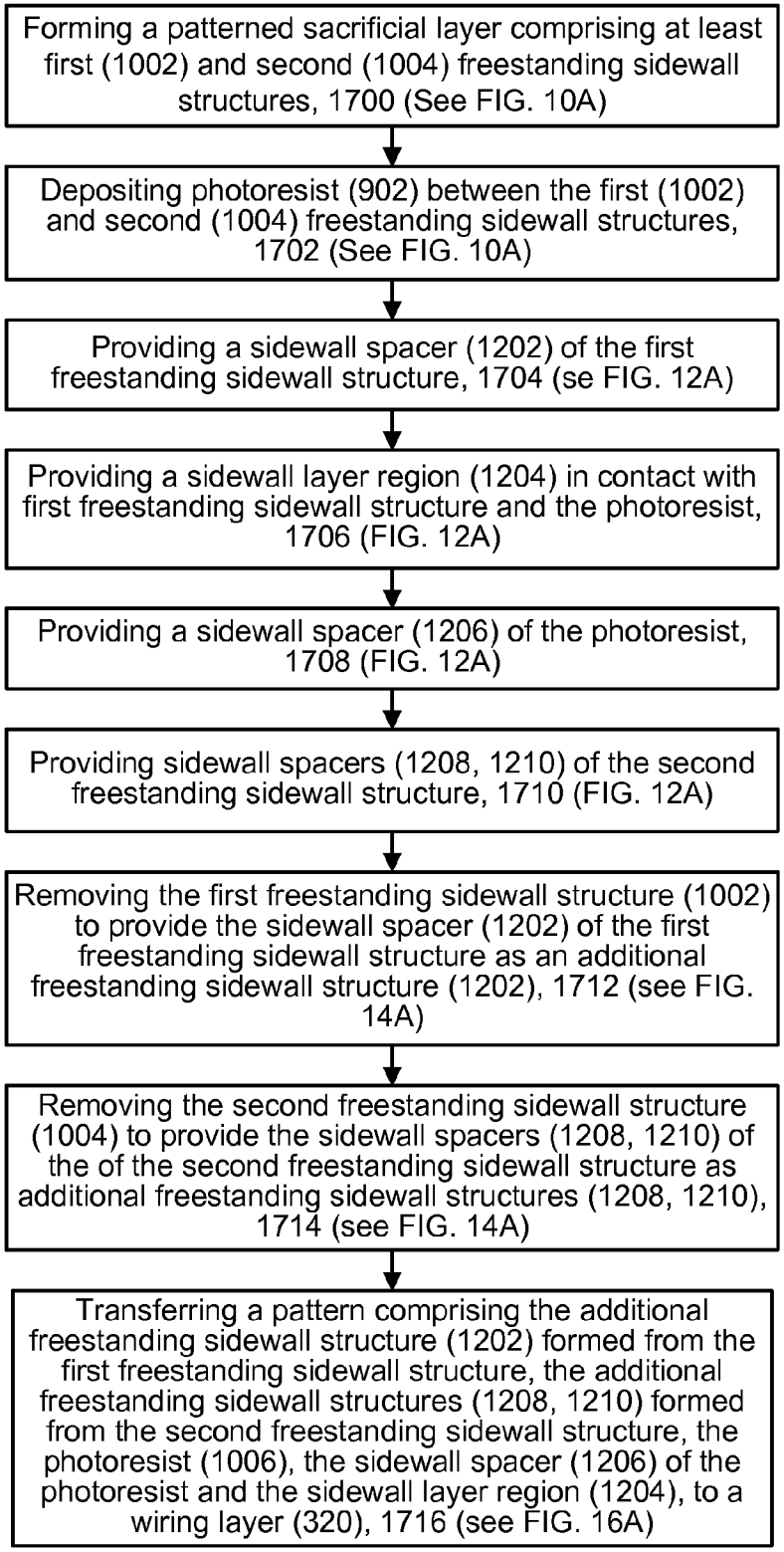
FIG. 17 depicts another example photolithographic method for fabricating a pattern which includes a line and a hook-up pad in a semiconductor device.

FIG. 17 depicts another example photolithographic method for fabricating a pattern which includes a line and a hook-up pad in a semiconductor device. The steps include: Forming a patterned sacrificial layer comprising at least first (1002) and second (1004) freestanding sidewall structures, 1700 (See FIG. 10A); Depositing photoresist (902) between the first (1002) and second (1004) freestanding sidewall structures, 1702 (See FIG. 10A); Providing a sidewall spacer (1202) of the first freestanding sidewall structure, 1704 (se FIG. 12A); Providing a sidewall layer region (1204) in contact with first freestanding sidewall structure and the photoresist, 1706 (FIG. 12A); Providing a sidewall spacer (1206) of the photoresist, 1708 (FIG. 12A); Providing sidewall spacers (1208, 1210) of the second freestanding sidewall structure, 1710 (FIG. 12A); Removing the first freestanding sidewall structure (1002) to provide the sidewall spacer (1202) of the first freestanding sidewall structure as an additional freestanding sidewall structure (1202), 1712 (see FIG. 14A); Removing the second freestanding sidewall structure (1004) to provide the sidewall spacers (1208, 1210) of the second freestanding sidewall structure as additional freestanding sidewall structures (1208, 1210), 1714 (see FIG. 14A); and Transferring a pattern comprising the additional freestanding sidewall structure (1202) formed from the first freestanding sidewall structure, the additional freestanding sidewall structures (1208, 1210) formed from the second freestanding sidewall structure, the photoresist (1006), the sidewall spacer (1206) of the photoresist and the sidewall layer region (1204), to a wiring layer (320), 1716 (see FIG. 16A).

Accordingly, it can be seen that a photolithographic method is provided for fabricating a wiring layer pattern which includes a line and a hook-up pad in a semiconductor device.

In one embodiment, a photolithographic method for fabricating a pattern in a semiconductor device includes: (a) depositing a first conformal spacer layer on a patterned, first sacrificial layer above a second sacrificial layer, (b) forming sidewall spacers of the patterned, first sacrificial layer, from the first conformal spacer layer, (c) etching to remove the first patterned sacrificial layer, causing the sidewall spacers to become a first set of freestanding structures, (d) depositing photoresist, (e) transferring a pattern formed by the first set of freestanding structures and the photoresist to the second sacrificial layer, resulting in a patterned, second sacrificial layer having at least first and second portions, (f) depositing a second spacer layer on the patterned, second sacrificial layer, (g) etching the second spacer layer to provide a sidewall spacer of the first portion of the second sacrificial layer, a sidewall spacer of the second portion of the second sacrificial layer, and a spanning region of the second spacer layer, which spans between the first portion of the second sacrificial layer and the second portion of the second sacrificial layer, (h) etching away the first portion of the second sacrificial layer, causing the sidewall spacer of the first portion of the second sacrificial layer to become an additional freestanding structure, and forming a gap between the additional freestanding structure and the spanning region of the second spacer layer, and (i) transferring a pattern formed by the additional freestanding structure and a combination of the spanning region of the second spacer layer, the second portion of the second sacrificial layer and the sidewall spacer of the second portion of the second sacrificial layer, to a wiring layer, where the additional freestanding structure defines a width of a line in the wiring layer, and the combination defines a hook-up pad in the wiring layer.

In another embodiment, a photolithographic method is provided for fabricating a pattern in a semiconductor device. The method includes: forming a first patterned sacrificial layer comprising at least first and second freestanding sidewall structures; depositing photoresist between the first and second freestanding sidewall structures; providing a sidewall spacer of the first freestanding sidewall structure; providing a sidewall layer region in contact with first freestanding sidewall structure and the photoresist; providing a sidewall spacer of the photoresist; providing sidewall spacers of the second freestanding sidewall structure; removing the first freestanding sidewall structure to provide the sidewall spacer of the first freestanding sidewall structure as an additional freestanding sidewall structure; removing the second freestanding sidewall structure to provide the sidewall spacers of the second freestanding sidewall structure as additional freestanding sidewall structures; and transferring a pattern comprising the additional freestanding sidewall structure formed from the first freestanding sidewall structure, the additional freestanding sidewall structures formed from the second freestanding sidewall structure, the photoresist, the sidewall spacer of the photoresist and the sidewall layer region, to a wiring layer.

In another embodiment, a photolithographic method is provided for fabricating a pattern in a semiconductor device. The method includes: forming sidewall spacers (702, 704) of a patterned, first sacrificial layer, from a first conformal spacer layer on the patterned, first sacrificial layer; etching to remove the first patterned sacrificial layer, causing the sidewall spacers to become a first set of freestanding structures (702, 704); depositing photoresist (902); transferring a pattern formed by the first set of freestanding structures and the photoresist to a second sacrificial layer, resulting in a patterned, second sacrificial layer having at least first (1002) and second (1006) portions; depositing a second spacer layer (1102) on the patterned, second sacrificial layer (step 8); etching the second spacer layer to provide a sidewall spacer (1202) of the first portion of the second sacrificial layer, a sidewall spacer (1206) of the second portion of the second sacrificial layer, and a spanning region (1204) of the second spacer layer which spans between the first portion of the second sacrificial layer and the second portion of the second sacrificial layer; etching away the first portion (1002) of the second sacrificial layer, causing the sidewall spacer (1202) of the first portion of the second sacrificial layer to become an additional freestanding structure, and forming a gap (1402) between the additional freestanding structure and the spanning region of the second spacer layer; providing a cover layer (1302) for the second portion of the second sacrificial layer to protect the second portion of the second sacrificial layer during the etching of the first portion of the second sacrificial layer; and transferring a pattern formed by the additional freestanding structure and a combination of the spanning region of the second spacer layer, the second portion of the second sacrificial layer and the sidewall spacer of the second portion of the second sacrificial layer, to a wiring layer (320).

Corresponding semiconductor devices are also provided.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A photolithographic method for fabricating a pattern in a semiconductor device, comprising:
    depositing a first conformal spacer layer on a patterned, first sacrificial layer above a second sacrificial layer;
    forming sidewall spacers of the patterned, first sacrificial layer, from the first conformal spacer layer;
    etching to remove the first patterned sacrificial layer, causing the sidewall spacers to become a first set of freestanding structures;
    depositing photoresist;
    transferring a pattern formed by the first set of freestanding structures and the photoresist to the second sacrificial layer, resulting in a patterned, second sacrificial layer having at least first and second portions;
    depositing a second spacer layer on the patterned, second sacrificial layer;
    etching the second spacer layer to provide a sidewall spacer of the first portion of the second sacrificial layer, a sidewall spacer of the second portion of the second sacrificial layer, and a spanning region of the second spacer layer which spans between the first portion of the second sacrificial layer and the second portion of the second sacrificial layer;
    etching away the first portion of the second sacrificial layer, causing the sidewall spacer of the first portion of the second sacrificial layer to become an additional freestanding structure, and forming a gap between the additional freestanding structure and the spanning region of the second spacer layer; and
    transferring a pattern formed by the additional freestanding structure and a combination of the spanning region of the second spacer layer, the second portion of the second sacrificial layer and the sidewall spacer of the second portion of the second sacrificial layer, to a wiring layer, the additional freestanding structure defines a width of a line in the wiring layer, and the combination defines a hook-up pad in the wiring layer.

2. The photolithographic method of claim 1, wherein:
    the transferring the pattern formed by the additional freestanding structure and the combination to the wiring layer comprises transferring the pattern formed by the additional freestanding structure and the combination to a hard mask layer to provide a patterned hard mask layer; and
    transferring a pattern of the patterned hard mask layer to the wiring layer.

3. The photolithographic method of claim 1, wherein:
    the gap defines a corresponding gap between the line and the hook-up pad.

4. The photolithographic method of claim 1, wherein:
    the gap spans the additional freestanding structure and a side of the spanning region of the second spacer layer which faces the additional freestanding structure.

5. The photolithographic method of claim 1, further comprising:
    providing a cover layer for the second portion of the second sacrificial layer to protect the second portion of the second sacrificial layer during the etching of the first portion of the second sacrificial layer.

6. The photolithographic method of claim 1, wherein:
    the first portion of the second sacrificial layer has a first side facing away from the second portion of the second sacrificial layer, and a second side facing the second portion of the second sacrificial layer;
    the sidewall spacer of the first portion of the second sacrificial layer is adjacent to the first side of the first portion of the second sacrificial layer;
    the second portion of the second sacrificial layer has a first side facing away from the first portion of the second sacrificial layer, and a second side facing the first portion of the second sacrificial layer; and the sidewall spacer of the second portion of the second sacrificial layer is adjacent to the first side of the second portion of the second sacrificial layer.

7. The photolithographic method of claim 1, wherein:
the hook-up pad is a landing pad for a vertically-extending contact.

8. The photolithographic method of claim 1, wherein:
the wiring layer comprises a metal film.

9. The photolithographic method of claim 1, wherein:
the wiring layer comprises a polysilicon layer; and
the method further comprises performing a salicidation process on the polysilicon layer.

10. The photolithographic method of claim 1, wherein:
the patterned, second sacrificial layer has a third portion;
the etching of the second spacer layer provides sidewall spacers of the third portion of the second sacrificial layer, one of the sidewall spacers of the third portion of the second sacrificial layer faces the sidewall spacer of the second portion of the second sacrificial layer, and another of the sidewall spacers of the third portion faces away from the sidewall spacer of the second portion of the second sacrificial layer;
the pattern which is transferred to the wiring layer is formed also by the sidewall spacers of the third portion of the second sacrificial layer; and
each of the sidewall spacers of the third portion of the second sacrificial layer defines a respective width of a respective line in the wiring layer.

11. The photolithographic method of claim 1, further comprising:
depositing insulating material which covers the hook-up pad in the wiring layer;
etching a hole to the hook-up pad; and
depositing conductive material in the hole.

12. The photolithographic method of claim 1, wherein:
the semiconductor device is a memory device.

13. A photolithographic method for fabricating a pattern in a semiconductor device, comprising:
forming a patterned sacrificial layer comprising at least first and second freestanding sidewall structures;
depositing photoresist between the first and second freestanding sidewall structures;
providing a sidewall spacer of the first freestanding sidewall structure;
providing a sidewall layer region in contact with first freestanding sidewall structure and the photoresist and extending between the first freestanding sidewall structure and the photoresist;
providing a sidewall spacer of the photoresist;
providing sidewall spacers of the second freestanding sidewall structure;
removing the first freestanding sidewall structure to provide the sidewall spacer of the first freestanding sidewall structure as an additional freestanding sidewall structure;
removing the second freestanding sidewall structure to provide the sidewall spacers of the second freestanding sidewall structure as additional freestanding sidewall structures; and
transferring a pattern comprising the additional freestanding sidewall structure formed from the first freestanding sidewall structure, the additional freestanding sidewall structures formed from the second freestanding sidewall structure, the photoresist, the sidewall spacer of the photoresist and the sidewall layer region, to a wiring layer.

14. The photolithographic method of claim 13, wherein:
a gap is provided between the additional freestanding sidewall structure formed from the first freestanding sidewall structure, and the sidewall layer region, the gap has width which is equal to a gap between a respective line in the wiring layer and a hook-up pad in the wiring layer.

15. The photolithographic method of claim 13, wherein:
the additional freestanding sidewall structure formed from the first freestanding sidewall structure, and the additional freestanding sidewall structures formed from the second freestanding sidewall structure, each define a width of a respective line in the wiring layer, and a combination of the photoresist, the sidewall spacer of the photoresist, and the sidewall layer region, define a hook-up pad in the wiring layer, the hook-up pad having a width equal to a sum of a width of the photoresist, a width of the sidewall spacer of the photoresist, and a width of the sidewall layer region.

16. The photolithographic method of claim 14, further comprising:
depositing insulating material which covers the hook-up pad in the wiring layer;
etching a hole to the hook-up pad; and
depositing conductive material in the hole.

17. A photolithographic method for fabricating a pattern in a semiconductor device, comprising:
forming sidewall spacers of a patterned, first sacrificial layer, from a first conformal spacer layer on the patterned, first sacrificial layer;
etching to remove the first patterned sacrificial layer, causing the sidewall spacers to become a first set of freestanding structures;
depositing photoresist;
transferring a pattern formed by the first set of freestanding structures and the photoresist to a second sacrificial layer, resulting in a patterned, second sacrificial layer having at least first and second portions;
depositing a second spacer layer on the patterned, second sacrificial layer;
etching the second spacer layer to provide a sidewall spacer of the first portion of the second sacrificial layer, a sidewall spacer of the second portion of the second sacrificial layer, and a spanning region of the second spacer layer which spans between the first portion of the second sacrificial layer and the second portion of the second sacrificial layer;
etching away the first portion of the second sacrificial layer, causing the sidewall spacer of the first portion of the second sacrificial layer to become an additional freestanding structure, and forming a gap between the additional freestanding structure and the spanning region of the second spacer layer;
providing a cover layer for the second portion of the second sacrificial layer to protect the second portion of the second sacrificial layer during the etching of the first portion of the second sacrificial layer; and
transferring a pattern formed by the additional freestanding structure and a combination of the spanning region of the second spacer layer, the second portion of the second sacrificial layer and the sidewall spacer of the second portion of the second sacrificial layer, to a wiring layer.

18. The photolithographic method of claim 17, wherein:
the additional freestanding structure defines a width of a line in the wiring layer, and the combination defines a hook-up pad in the wiring layer.

19. The photolithographic method of claim 18, wherein:
the gap defines a corresponding gap between the line and the hook-up pad.

20. The photolithographic method of claim 18, further comprising:
depositing insulating material which covers the hook-up pad in the wiring layer;
etching a hole to the hook-up pad; and
depositing conductive material in the hole.

* * * * *